United States Patent
Bakker et al.

(10) Patent No.: US 7,161,653 B2
(45) Date of Patent: Jan. 9, 2007

(54) LITHOGRAPHIC APPARATUS HAVING A CONTAMINANT TRAPPING SYSTEM, A CONTAMINATION TRAPPING SYSTEM, A DEVICE MANUFACTURING METHOD, AND A METHOD FOR IMPROVING TRAPPING OF CONTAMINANTS IN A LITHOGRAPHIC APPARATUS

(75) Inventors: Levinus Pieter Bakker, Helmond (NL); Vadim Yevgenyevich Banine, Helmond (NL); Arnoud Wassink, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/944,422

(22) Filed: Sep. 20, 2004

(65) Prior Publication Data

US 2006/0061740 A1  Mar. 23, 2006

(51) Int. Cl.
*G03B 27/52* (2006.01)
*G03B 27/72* (2006.01)

(52) U.S. Cl. .......................................... 355/30; 355/71
(58) Field of Classification Search ................. 355/30, 355/53, 67, 71; 378/34, 160
See application file for complete search history.

(56) References Cited

U.S. PATENT DOCUMENTS

| | | | |
|---|---|---|---|
| 6,753,941 B1 * | 6/2004 | Visser | 355/30 |
| 6,927,403 B1 | 8/2005 | Singer et al. | |
| 2004/0108465 A1 | 6/2004 | Bakker et al. | |
| 2004/0184014 A1 * | 9/2004 | Bakker et al. | 355/30 |

FOREIGN PATENT DOCUMENTS

| | | |
|---|---|---|
| EP | 1 223 468 A1 | 7/2002 |
| EP | 1 274 287 A1 | 1/2003 |
| EP | 1 391 785 A1 | 2/2004 |
| WO | WO 99/42904 | 8/1999 |

* cited by examiner

*Primary Examiner*—Rodney Fuller
(74) *Attorney, Agent, or Firm*—Pillsbury Winthrop Shaw Pittman LLP (57) ABSTRACT

A lithographic apparatus includes an illumination system configured to condition a radiation beam substantially from a light emitting point. The illumination system includes a contaminant trapping system. The trapping system includes a contaminant trap having a central zone and a peripheral zone. The trap includes a plurality of platelets that extend substantially outwards through the peripheral zone. The light emitting point is in a plane with which the platelets coincide. Each of the platelets has a normal with a component directed towards the central zone.

89 Claims, 6 Drawing Sheets

LITHOGRAPHIC APPARATUS HAVING A CONTAMINANT TRAPPING SYSTEM, A CONTAMINATION TRAPPING SYSTEM, A DEVICE MANUFACTURING METHOD, AND A METHOD FOR IMPROVING TRAPPING OF CONTAMINANTS IN A LITHOGRAPHIC APPARATUS

FIELD

The present invention relates to a lithographic apparatus having a contaminant trapping system, to a contaminant trapping system for use in a illumination system of a lithographic apparatus, to a device manufacturing method, and to a method for improving trapping of contaminants in a illumination system of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the radiation used to apply the desired pattern onto the substrate. To produce intergrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range of 5 to 20 nm, especially around 13.5 nm. Such radiation is termed extreme ultraviolet (EUV) or soft x-ray and possible sources include, for example, laser produced plasma sources, and discharge plasma sources or a synchrotron radiation from electron storage rings.

Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136–156 (2000); M. W. McGeoch, Tower Scaling of a Z-pinch Extreme Ultraviolet Source", Proc. SPIE 3997, pp. 861–866 (2000); W. T. Silfvast, M. Klosner, G. Shimkaveg, H. Bender, G. Kubiak, N. Fomaciari, "High-Power Plasma Discharge Source at 13.5 and 11.4 nm for EUV lithography", Proc. SPIE 3676, pp. 272–275 (1999); and K. Bergmann et al., "Highly Repetitive, Extreme Ultraviolet Radiation Source Based on a Gas-Discharge Plasma", Applied Optics, Vol. 38, pp. 5413–5417 (1999).

EUV radiation sources, such as discharge plasma radiation sources referred to above, may require the use of a rather high partial pressure of a gas or vapor to emit EUV radiation. In a discharge plasma source, for example, a discharge is created in between electrodes, and a resulting partially ionized plasma may subsequently be caused to collapse to yield a very hot plasma that emits radiation in the EUV range. The very hot plasma is quite often created in Xe, since a Xe plasma radiates in the Extreme UV (EUV) range around 13.5 nm. For an efficient EUV production, a typical pressure of 0.1 mbar is needed near the electrodes to the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To achieve this, the source may be contained in its own vacuum chamber that is separated by a chamber wall from a subsequent vacuum chamber in which the collector mirror and illumination optics may be obtained.

The vacuum wall may be made transparent to EUV radiation by a number of apertures in the wall, provided by a channel array or so-called foil trap, such as described in European Patent application number EP-A-1 057 079, which is incorporated herein by reference. In order to reduce the number of particles propagating along the optical axis, a channel array or "foil trap" has been proposed in EP-A-1 223 468 and EP-A-1 057 079. This foil trap consists of a channel-like structure that includes lamella shaped walls close together in order to form a flow resistance, but not too close so as to let the radiation pass without obstructing it. This foil trap is incorporated herein by reference.

The contamination of the optical components of the lithography apparatus by relatively heavy, micron-sized particles or smaller particles having a relatively low velocity, which are emitted by the EUV source and which pass the channel array in the vacuum wall of the source poses a serious problem, as this contamination results in degradation of the optical components and considerably increases the operational costs of an EUV lithographic projection apparatus.

It has been proposed to provide a rotating foil trap, as disclosed in EP 1 274 287 A1, which is incorporated herein by reference. This foil trap includes platelets which extend radially from a rotation axis. In other words, the rotation axis is parallel to all the platelets. In operation, gas molecules or other contaminating particles that hit the platelets are, on average, directed into a direction of the motion of the platelets.

The surface area of the platelets is generally proportional to the length of the rotational axis around which the platelets rotate.

EP 1 391 785 proposes a contaminant trapping system that includes two foil traps which are aligned such that radiation may pass through both foil traps. The foil traps may rotate with respect to each other so that particles which still manage to pass through the first foil trap may be trapped by the second foil trap.

SUMMARY

It is an aspect of the present invention to provide a lithographic apparatus that has a illumination system including a contaminant trapping system with an improved efficiency in comparison to prior art contaminant trapping systems.

It is an aspect of the present invention to provide a lithographic apparatus that includes an illumination system that has a contaminant trapping system that is capable of generating a pressure difference between an entrance of the contaminant trapping system and an exit of the contaminant trapping system.

It is an aspect of the present invention to provide a lithographic apparatus that includes an illumination system that has a contaminant trapping system that allows for a higher uniformity of the radiation that exits the contaminant trapping system.

It is an aspect of the present invention to provide for use in a lithographic apparatus a more efficient contaminant trapping system for use in a illumination system of a lithographic apparatus.

It is an aspect of the present invention to provide a contaminant trapping system that is capable of generating a pressure difference between an entrance of the trapping system and an exit of the trapping system.

It is an aspect of the present invention to provide for use in a lithographic apparatus a contaminant trapping system out of which in use relatively uniform radiation exits.

It is an aspect of the present invention to provide a device manufacturing method in which relatively little contamination or no contamination at all has entered such that it influences performance of the method so that a relatively uniform beam of radiation may be used.

It is an aspect of the present invention to provide a method for improving trapping of contaminants in illumination system of a lithographic apparatus.

It is an aspect of the present invention to provide a lithographic apparatus that has a contaminant trapping system that allows for a high transmission of light even under circumstances where slight deformation of the platelets occurs.

It is an aspect of the present invention to provide a contaminant trapping system that allows for high transmission of light even under circumstances where slight deformation of the platelets occurs.

According to an aspect of the invention, there is provided a lithographic apparatus that includes an illumination system configured to condition radiation beams substantially from a light emitting point. The illumination system includes a contaminant trapping system. The trapping system includes a contaminant trap that has a central zone and a peripheral zone. The trap including a plurality of platelets that extend substantially outwards through the peripheral zone. The light emitting point is in a plane with which the platelets coincide. Each of the platelets has a normal, with a component directed towards the central zone.

According to an aspect of the invention, there is provided a contaminant trapping system for use in an illumination system of a lithographic apparatus. The trapping system includes a contaminant trap that has a central zone and a peripheral zone. The trap includes a plurality of platelets that extend substantially outwards through the peripheral zone. Each of the platelets has a normal with a component directed towards the central zone. The platelets are oriented such that all planes which coincide with the platelets meet outside the trap at a predetermined point.

According to an aspect of the invention, there is provided a device manufacturing method including: conditioning a radiation beam substantially from a light emitting point using an illumination system; and trapping contaminant particles in the illumination system using a trapping system that includes a contaminant trap having a central zone and a peripheral zone. The trap includes a plurality of platelet extending substantially outwards through the peripheral zone. Each of the platelets has a normal with a component directed towards the central zone. The platelets are oriented such that all planes which coincide with the platelets meet outside the trap substantially at a predetermined point which substantially coincides with a light emitting point of the illumination system.

According to an aspect of the invention, there is provided a method for improving trapping of contaminants in an illumination system of a lithographic apparatus. The method includes using a trapping system that includes a contaminant trap having a central zone and a peripheral zone. The trap includes a plurality of platelets extending substantially outwards through the peripheral zone. Each of the platelets has a normal with a component directed towards the central zone. The platelets are oriented such that all planes which coincide with the platelets meet outside the trap substantially at a predetermined point which coincides with a light emitting point of the illumination system.

According to an aspect of the invention, there is provided a lithographic apparatus that includes an illumination system configured to condition a radiation beam substantially from a light emitting point. The illumination system includes a contaminant trapping system. The trapping system includes a first contaminant trap having platelets and a second contaminant trap having platelets. The first and the second contaminant traps are aligned so that light emitted from the light emitting point can propagate through the first and the second contaminant traps. One of the first and the second contaminant traps can rotate relative to the other of the first and the second contaminant traps around a virtual line that substantially extends through the light emitting point. The platelets of one of the first and the second contaminant traps differ in number and/or angular distribution from the other of the first and the second contaminant traps.

According to an aspect of the invention, there is provided a contaminant trapping system for use in an illumination system of a lithographic apparatus. The trapping system includes a first contaminant trap having platelets and a second contaminant trap having platelets. The first and the second contaminant traps being aligned so that in use, light emitted from a predetermined point situated outside the first and the second contaminant traps can propagate through the first and the second contaminant traps. One of the first and the second contaminant traps can rotate relative to the other of the first and the second contaminant traps around a virtual line that substantially extends through the predetermined point. The platelets of one of the first and the second contaminant traps differ in number and/or angular distribution from the other of the first and the second contaminant traps.

According to an aspect of the invention, there is provided a lithographic apparatus that includes an illumination system configured to condition a radiation beam substantially from a light emitting point. The illumination system includes a contaminant trapping system. The trapping system includes a first contaminant trap having platelets and a second contaminant trap having platelets. The first and the second contaminant traps are aligned so that light emitted from the light emitting point can propagate through the first and the second contaminant traps. One of the first and the second contaminant traps can rotate relative to the other of the first and the second contaminant trap around a virtual line that substantially extends through the light emitting point. The lithographic apparatus further includes a patterning device which is capable of imparting the radiation beam with a pattern in its cross-section to form a patterned radiation beam. The illumination system is arranged to at least partly compensate upstream of the patterning device a non-uniformity in the radiation beam.

According to an aspect of the invention, there is provided a contaminant trapping system for use in an illumination system of a lithographic apparatus. The trapping system includes a fist contaminant trap having platelets and a second contaminant trap having platelets. The first and the second contaminant trap are aligned so that in use, light emitted from a predetermined point situated outside the first and the second contaminant traps can propagate through the first and the second contaminant traps. One of the first and the second contaminant traps can rotate relative to the other of the first and the second contaminant traps around a virtual line that substantially extends through the predetermined point. The contaminant trapping system is arranged such that is use, a substantially predetermined non-uniformity is present in the radiation beam when the beam exits the first and the second contaminant traps.

According to an aspect of the invention, there is provided a lithographic apparatus including an illumination system configured to condition a radiation beam substantially from a light emitting point. The illumination system includes a contaminant trapping system. The trapping system includes a contaminant trap that has a central zone and a peripheral zone. The trap includes a plurality of platelets that extend substantially outwards through the peripheral zone. Each of the platelets is hinged at a hinge-axis. Each hinge-axis is oriented such that a virtual line coinciding with the respective hinge-axis extends through the light emitting point when the corresponding platelet is in a straight plane.

According to an aspect of the invention, there is provided a contaminant trapping system for use in an illumination system of a lithographic apparatus. The trapping system includes a contaminant trap that has a central zone and a peripheral zone. The trap includes a plurality of platelets that extend substantially outwards through the peripheral zone. Each of the platelets is hinged at a hinge-axis. Each hinge-axis is oriented such that a virtual line coinciding with the respective hinge-axis extends through a predetermined point when the corresponding platelet is in a straight plane. The predetermined point is intended to correspond with a light emitting point of the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
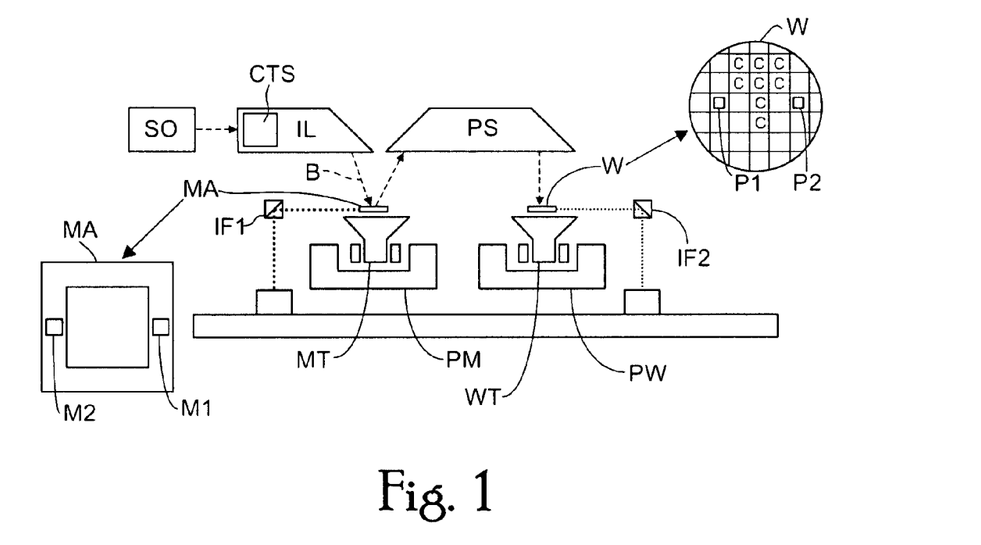
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The illumination system IL includes a contaminant trapping system CTS. The contaminant trapping system CTS will further be described and explained below. The contaminant trapping system CTS may also be part of the source SO. In that case, the source is also considered to be part of the illumination system IL.

The support structure MT supports, i.e. bears the weight of, the patterning device MA. It holds the patterning device MA in a manner that depends on the orientation of the patterning device MA, the design of the lithographic apparatus, and other conditions, such as, for example, whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source SO and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. The patterning device MA and the substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
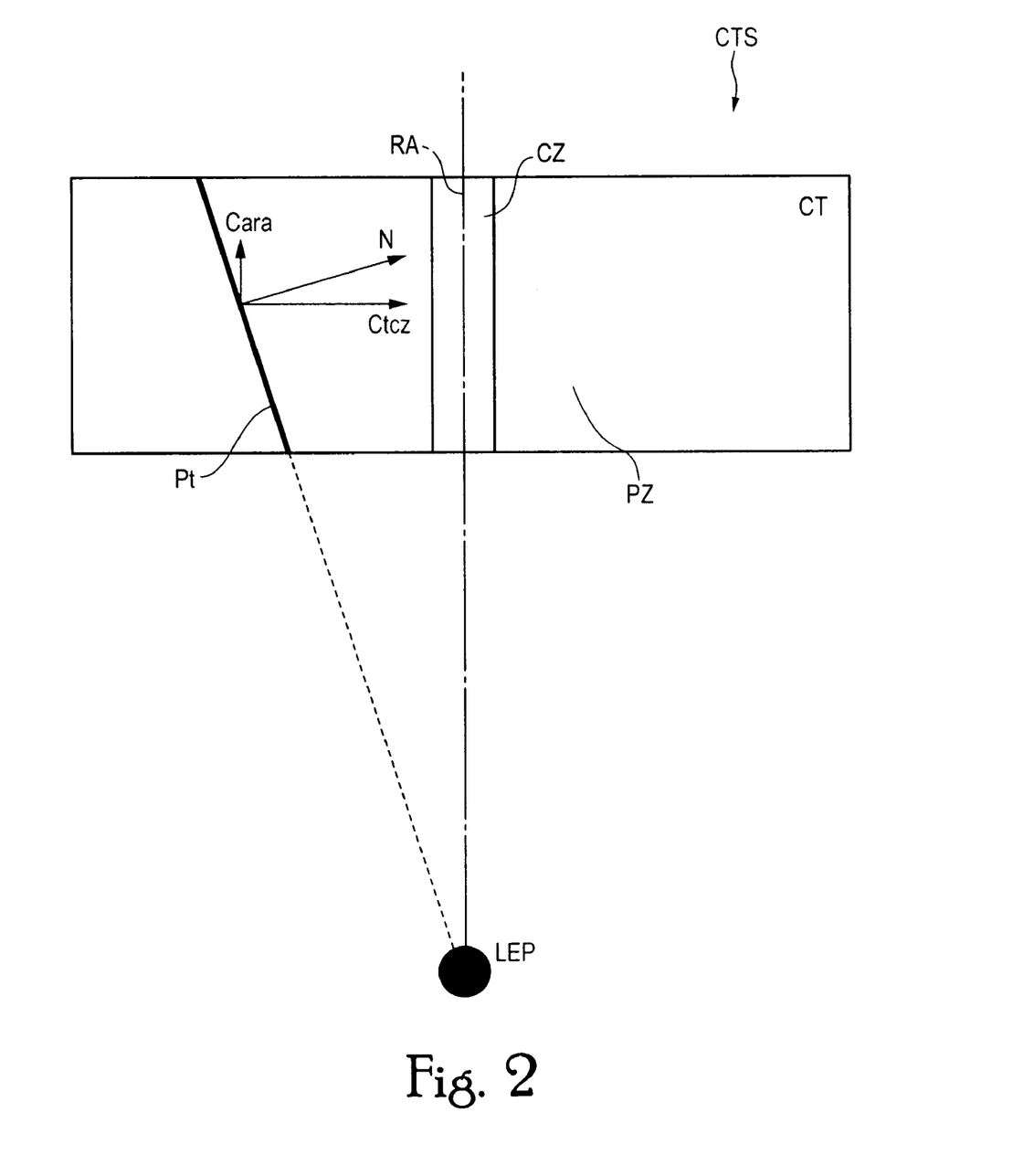
FIG. 2 depicts schematically a part of a lithographic apparatus according to an embodiment of the invention.
Figure 3:
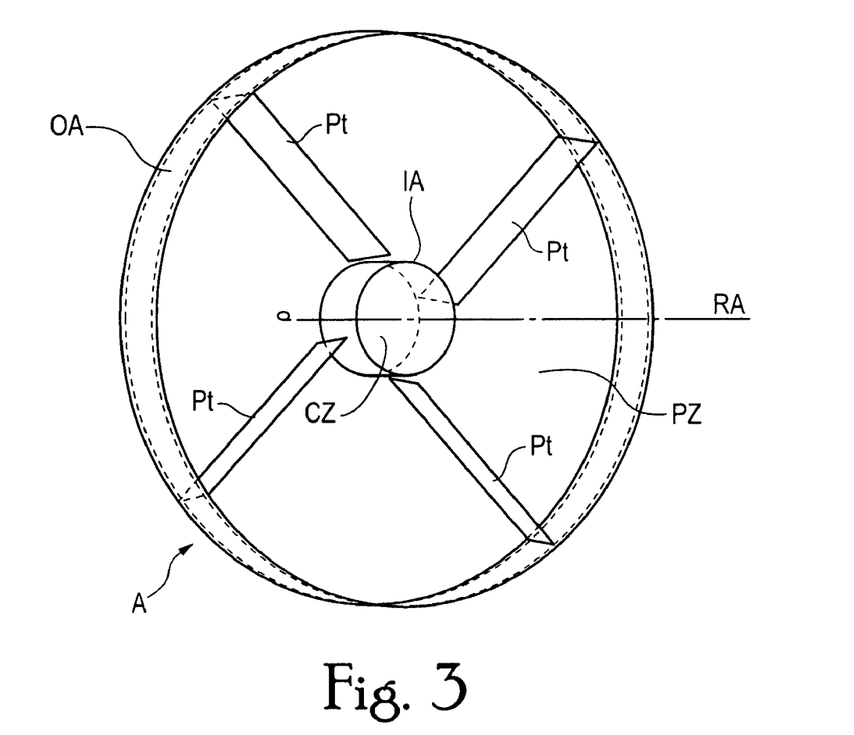
FIG. 3 depicts schematically a part of an embodiment of a lithographic apparatus according to the invention.
Figure 4:
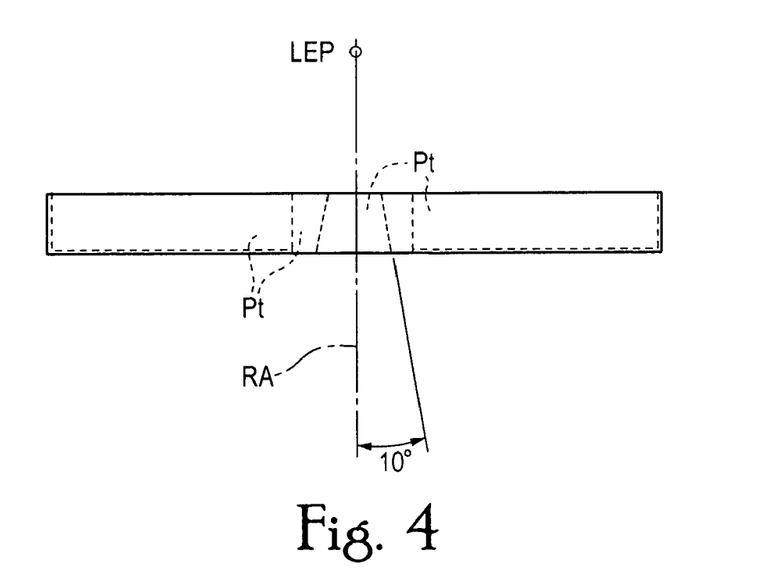
FIG. 4 depicts schematically a view in the direction of arrow A of the part of the embodiment shown in FIG. 3.
Figure 5:
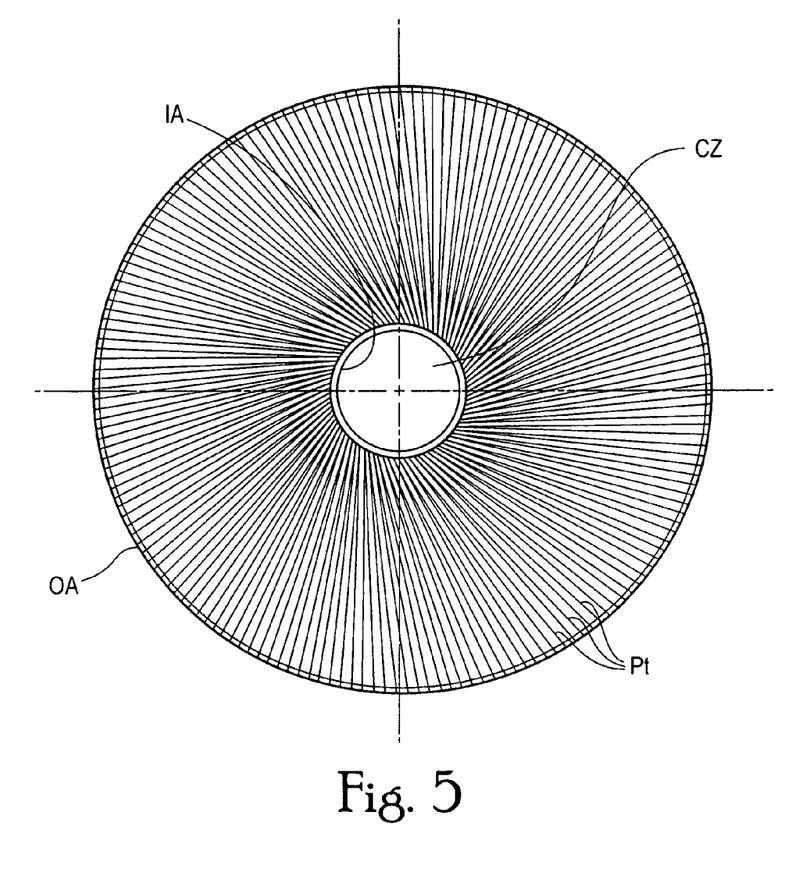
FIG. 5 depicts schematically a view of a part of an embodiment of an lithographic apparatus according to the invention.

FIG. 2 depicts schematically a part of a lithographic apparatus that includes an illumination system (not shown) configured to condition a radiation beam. The radiation beam (not shown) is substantially conditioned from a light emitting point LEP which is, in this example, together with a source SO, part of the illumination system. The illumination system includes a contaminant trapping system CTS. The trapping system includes at least one contaminant trap CT having a central zone CZ and a peripheral zone PZ. The trap includes at least one platelet Pt extending substantially outwards through the peripheral zone. This is more clearly shown in FIGS. 3, 4 and 5. For the sake of clarity FIG. 2, only shows one platelet Pt. The platelet as shown in FIG. 2 extends in a direction perpendicular to the plane of the drawing. The light emitting point LEP is in a plane with which the at least one platelet Pt coincides. The at least one platelet Pt has a normal N with a component directed towards the central zone CZ. This component is indicated by dotted arrow Ctcz. FIGS. 3, 4 and 5 also show that the contaminant trapping system may include a trap having a plurality of platelets Pt.

An advantage of the contaminant trapping system discussed so far is that the actual surface of each platelet is much larger than the actual surface of a platelet which extends radially and does not coincide with a plane that extends through the light emitting point LEP. Consequently, the probability that a contaminant particle is trapped by the contaminant trap as disclosed in this specification, is larger than the probability related to a contaminant trap of the prior art. Furthermore, a contaminant particle, such as a gas molecule that hits the platelet, will on average be scattered from the surface of the platelet in a direction of the normal. This allows for directing the contaminant particles towards the central zone. By applying an appropriate pressure difference over the central zone CZ in a direction such that the contaminant particles present in the central zone will be sucked away towards, for example, the light emitting point LEP, a large number of contaminant particles will not exit the contaminant trapping system in a direction of propagation of the radiation. In other words, these particles will not enter the optical path of the lithographic apparatus, i.e. a downstream part of the illumination system.

The central zone CZ may include a rotation axis RA around which the platelets Pt can rotate. The rotation axis coincides with a virtual line that extends substantially through the light emitting point LEP. When the platelets rotate around the rotation access RA, the trap actually acts as a turbo pump. Further enhancing the efficiency of the contaminant trapping system. The particles are directed towards the central zone CZ and via the pressure difference, sucked away into a direction away from the direction of propagation of radiation.

In an embodiment of a lithographic apparatus according to the invention, the plurality of platelets has a rotational symmetry with respect to the central zone CZ. This leads to a rotationally balanced contaminant trapping system and a mechanically stable rotating system. In an embodiment where the central zone includes a rotation access around which the at least one platelet can rotate, the contaminant trap may be provided with a driving mechanism for rotating the trap. In that case, the platelets have a rotational symmetry with respect to the rotation axis. The driving mechanism may be such that the trap can rotate with a speed at which it has been shown to efficiently counteract contaminant particles exiting the contaminant trap system into a direction of propagation of the radiation.

It is possible that the driving mechanism is situated outside the central zone. In that case, it remains possible to collect the contaminant particles in the central zone and/or to guide them away from the central zone in a predetermined direction which is different from the direction of propagation of radiation. It will be clear that in the embodiments discussed so far, the platelets are not parallel to the rotation access RA. FIG. 3 and FIG. 4 show in perspective and in a view along arrow A respectively, the orientation of the platelets Pt with respect to the rotation access RA. The platelets Pt are not parallel to the rotation access. The angle enclosed by the platelet Pt and the rotation access RA depends in fact on the distance between the light emitting point LEP and the platelets Pt in the contaminant trapping system. In FIG. 4, this angle is shown to be about 10 degrees. As a plane is defined by three points, and the platelets in the contaminant trapping system according to an embodiment of the invention have a normal with a component directed towards the central zone, and lie in a plane which extends through the light emitting point, two points of the plane with which the platelet will coincide may be freely chosen.

As shown in FIG. 3, each platelet Pt may towards the central zone be connected with an inner annular support IA, and at an end away from the central zone CZ be connected with an outer annular support OA. The driving mechanism may be arranged to rotate the contaminant trap by applying forces to the outer annular support in a direction of rotation.

FIG. 5 shows by way of example at least a part of a contaminant trap having a relatively large number of platelets Pt as described herein above.

Figure 6:
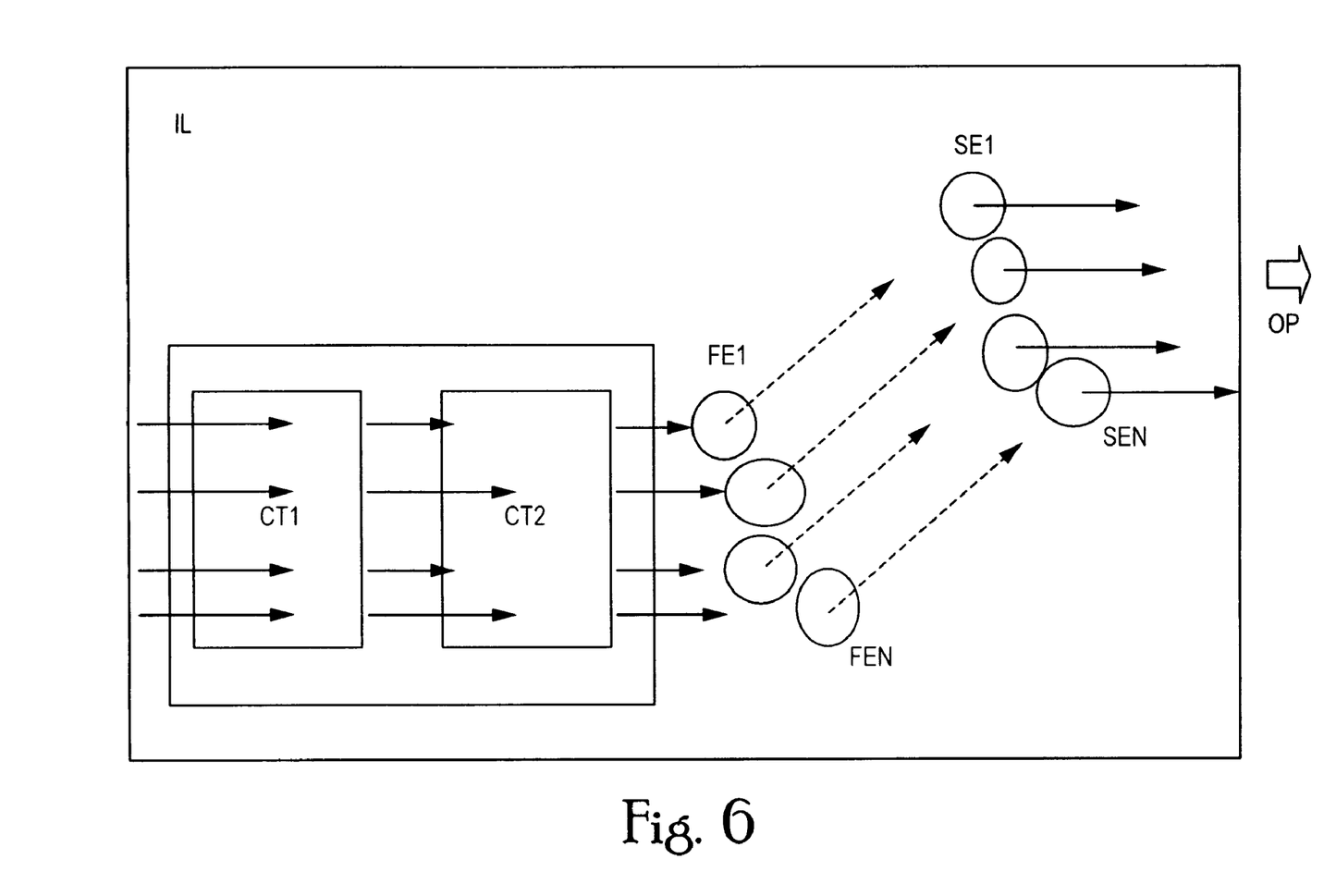
FIG. 6 depicts schematically a part of a lithographic apparatus according to an embodiment of the invention.

FIG. 6 shows a part of a lithographic apparatus according to an embodiment of the invention. The part shown is a contaminant trapping system CTS in an illumination system IL of a lithographic apparatus according to an embodiment of the invention. The contaminant trapping system CTS includes at least two contaminant traps CT1, CT2. Each contaminant traps CT1, CT2 has platelets (not shown in FIG. 6). The two contaminant traps are aligned so that light emitted from the light emitting point (not shown) may propagate through the two contaminant traps CT1, CT2. Contaminant traps CT1, may rotate relative to contaminant trap CT2 around a virtual line that substantially extends through the light emitting point. The contaminant traps may be in accordance with embodiments shown in FIG. 2 to 5. However the contaminant traps may also be in accordance with other contaminant traps as described in, for example, the prior art. Although not shown, an embodiment of a contaminant trapping system as shown in FIG. 6 may be such that the platelets of one of the two contaminant traps CT1, CT2 differ in number and/or angular distribution from the other one of the contaminant trap CT1, CT2. This has the advantage that in use a non-uniformity is reduced in a radiation beam which exits the contamination trappings system. This is explained as follows. An extreme non-uniformity in the radiation beam arises when the two contaminant traps CT1, CT2 having equal number and equal distribution of platelets have different rotational speeds. In that case, two extreme positions of the traps are possible. In a first extreme position, the contaminant traps CT1, CT2 are aligned. Almost the entire cross-section of the beam leaving the contaminant trapping system shows full intensity of radiation. In a second extreme position the platelets of the second contaminant trap CT2 have a position between the platelets of the first contaminant trap CT1 viewed in a direction of propagation of the radiation. Much less than the entire cross-section of the beam leaving the contaminant trapping system does then show full intensity of radiation. When the contaminant trap CT1, CT2 are mutually different in number and/or angular distribution, such that at least one of the platelets of the contaminant trap CT2 is at any rotational position blocking radiation that passes through contaminant trap CT1, the possibility of the first non-uniformity is ruled out. In that sense, the non-uniformity in the radiation beam is reduced with respect to a situation in which the contaminant trapping system includes two contaminant traps arranged such that at one or more rotational positions, each platelet of the downstream contaminant trap CT2 is, viewed in the direction of propagation of the radiation, aligned with a platelet of the upstream contaminant trap CT1.

In this embodiment, the lithographic apparatus may further include a patterning device that is capable of imparting the radiation beam with a pattern in its cross-section to form a patterned radiation beam. By the difference in contaminant traps as described above, the illumination system is arranged to reduce upstream of the patterning device any non-uniformity in the radiation beam. By applying a different number and/or angular distribution of the platelets between the two contaminant traps CT1, CT2, the maximum difference in intensity per cross-section of the radiation beam may be reduced. Note that the differences in length of the arrows coming in, in, and leaving the CTS represent the differences in intensity in a cross-section of the radiation beam.

It is, for example, possible to apply 180 equally distributed platelets in the first contaminant trap CT1, and, for example, 175 equally distributed platelets in the second contaminant trap CT2. A person skilled in the art may, by routine experiments and/or calculations, be able to apply an optimal combination. It should be noted that the difference in number and/or angular distribution may also be achieved by applying different thicknesses of the platelets. Hence, where reference is made to different and/or angular distribution of the platelets, this is also understood to refer to possible differences in thicknesses of the platelets so that the non-uniformity is likewise reduced.

FIG. 6 shows a part of a lithographic apparatus that may include a patterning device (not shown) that is capable of imparting the radiation beam with a pattern in its cross-section to form a patterned radiation beam. The illumination system is, according to an embodiment of the invention, arranged to reduce upstream of the patterning device a non-uniformity in the radiation beam. Alternatively, or in addition to the above described arrangement of the contaminant traps, it is also possible that the contaminant traps CT1, CT2 are arranged such that in use a substantially predetermined non-uniformity is present in the radiation beam when the radiation beam exits the contaminant trapping system, i.e. the two contaminant traps CT1, CT2. The illumination system is, according to this embodiment, provided with a first and second set of reflective elements, as schematically shown in FIG. 6, and referred to by FE1-FEN and SE1-SEN respectively. Each reflective element of the first set FE1-FEN is arranged to reflect a part of the radiation beam downstream the at least two contaminant traps onto a reflective element of the second set SE1-SEN. Each reflective element of the second set SE1-SEN is arranged to reflect radiation beam in a further optical path towards the patterning device. This optical path is indicated by open arrow OP. Each reflective element, that is each reflective element of the first set of reflective elements FE1-FEN and each reflective element of the second set of reflective elements SE1-SEN, has a predetermined position and shape so that in use the predetermined non-uniformity in the radiation beam is reduced. Note that the differences in the length of the arrows inciding on the first set of reflective elements has been cancelled out in the arrows reflecting from the second set of reflective elements, schematically showing the principle.

The first set of reflective elements may correspond to the first optic element 102 as described in DE 101 38 284 A1, incorporated herein by reference. The second set of reflective elements may correspond to the second optical element 104 as described in DE 101 38 284 A1. It can easily be shown by those skilled in the art that when, for example, the first contaminant trap CT1 includes a first number of equally distributed platelets and the second contaminant trap CT2 includes a second number of equally distributed platelets, whereby the first number is different from the second number, a cross-section of the radiation beam exiting the contaminant trapping system will show so-called Moiré fringes when the first contaminant trap CT1 rotates with respect to the second contaminant trap CT2. Although the Moiré fringes will in this cross-section rotate around a center of the beam, it is possible to tailor the contaminant traps CT1 and CT2 such that the Moiré fringes have in the cross-section per unit of time a position where they are present most frequently. In other words, it is possible to provide a well-defined non-uniformity in the radiation beam. This well-defined non-uniformity in the radiation beam may be tailored towards the predetermined position and shape of the first set of reflective elements and the second set of reflective elements. It may also be possible to tailor the position and shape of the first set and second set of reflective elements towards the non-uniformity present in the radiation beam which exits the contaminant trapping system.

Figure 7:
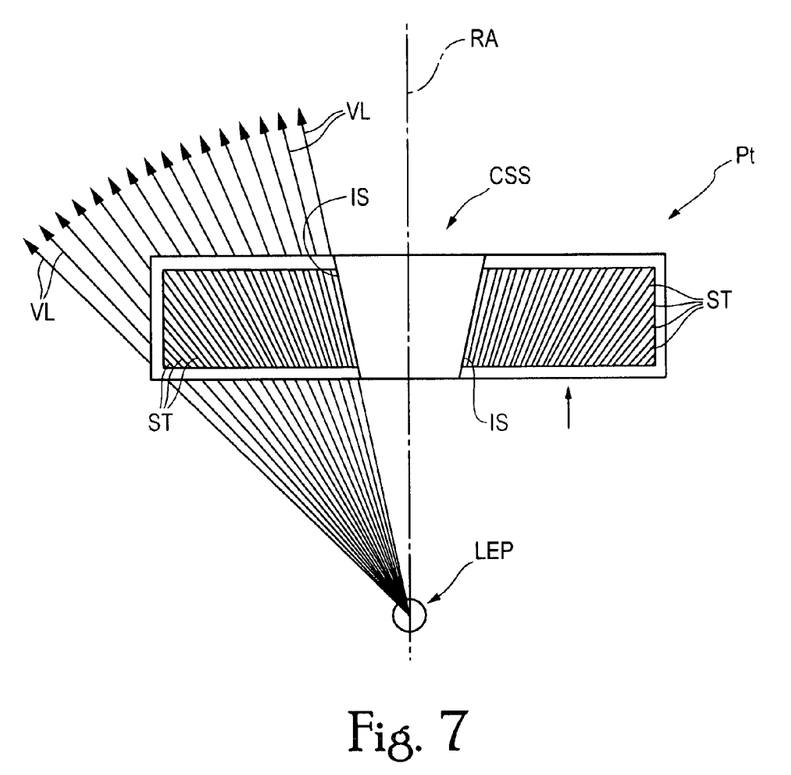
FIG. 7 depicts schematically a platelet according to a part of an embodiment of the invention.

FIG. 7 shows an example of a platelet that may be used in any of the embodiments of a contaminant trap and/or contaminant trapping system described above. The platelet Pt or at least a part thereof is hinged at a hinge-axis. Each hinge-axis is oriented such that a virtual line VL coinciding with the respective axis extends through the light emitting point LEP when the platelet Pt is in a straight plane. In the embodiment shown, the platelet includes a plurality of slots ST. Each slot ST is oriented such that the virtual line VL coinciding with a longitudinal direction of the respective slot ST extends through the light emitting point LEP when the platelet Pt is in a straight plane. In other words, the parts of the platelet in line with the slots form the hinging parts of the platelet. Losses of transmission of radiation passing through a contaminant trap having a platelet shown in FIG. 7 will not be as significant as compared to the losses in transmission of radiation exiting a contaminant trap not having such a platelet wherein a slight deformation of the platelet occurs. It is been found that light rays emitting by the light emitting point remain parallel to parts of the platelet regardless of the slight bending of the platelet, when a platelet as shown in FIG. 7 is applied. Losses of transmission due to a slight miss-alignment of the platelet during production, or due to deformation during rotation of the platelet, are reduced by a platelet as shown in FIG. 7. FIG. 7 shows a simple embodiment of a platelet that is hinged. Inducing a weakness by providing slots is a relatively inexpensive and simple method for reducing the loss of transmission when radiation passes a contaminant trap having platelets. It should be noted that it is also possible to provide only the inner slot IS, close to a central supporting structure CSS of the platelet Pt. It is also possible to provide a platelet with a plurality of hinges, i.e. slots, so that the platelet includes a plurality of parts which can be hinged with respect to each other. The platelet, when in a straight plane, does not have to be parallel to a rotation axis RA. The platelet Pt may also be oriented as shown in FIGS. 3, 4, and 5 of the specification. Bending of the platelet, i.e. hinging of the parts of the platelet connected to a hinge may, in use, be induced by gas friction. When the platelets are not parallel to the rotation axis RA, the contaminant trap provided with such platelets may act as a pump.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam substantially from a light emitting point,
    wherein the illumination system comprises a contaminant trapping system, the trapping system comprising a contaminant trap having a central zone and a peripheral zone, the trap comprising a plurality of platelets, each of the platelets extending from the central zone substantially outwards through the peripheral zone, each of the platelets coinciding with a virtual plane that extends substantially through the light emitting point, and each of the platelets having a normal with a component directed towards the central zone.

2. A lithographic apparatus according to claim 1, wherein the central zone comprises a rotation axis around which the plurality of platelets can rotate, the rotation axis coinciding with a virtual line that extends substantially through the light emitting point.

3. A lithographic apparatus according to claim 2, wherein the contaminant trap is provided with a driving mechanism for rotating the trap.

4. A lithographic apparatus according to claim 3, wherein the driving mechanism is situated outside the central zone.

5. A lithographic apparatus according to claim 1, wherein the trapping system comprises a plurality of contaminant traps.

6. A lithographic apparatus according to claim 1, wherein the plurality of platelets have a rotational symmetry with respect to the central zone.

7. A lithographic apparatus according to claim 1, wherein the trapping system comprises a first contaminant trap having platelets and a second contaminant trap having platelets, the first and the second contaminant traps being aligned so that some light emitted from the light emitting point can propagate through the first and the second contaminant traps, wherein the first contaminant trap can rotate relative to the second contaminant trap around a virtual line that substantially extends through the light emitting point.

8. A lithographic apparatus according to claim 7, wherein the platelets of one of the first and the second contaminant traps differ in number and/or angular distribution from the number and/or angular distribution of the platelets of the other of the first and the second contaminant traps, such that at any rotational position, one or more of the platelets of one of the first and the second contaminant traps is blocking radiation that has passed through the other of the first and the second contaminant traps.

9. A lithographic apparatus according to claim 7, wherein the lithographic apparatus further comprises a patterning device which is capable of imparting the radiation beam with a pattern in its cross-section to form a patterned radiation beam, the illumination system further being arranged to reduce a non-uniformity in the radiation beam upstream of the patterning device.

10. A lithographic apparatus according to claim 9, wherein the first and the second contaminant traps are arranged such that in use a substantially predetermined non-uniformity is present in the radiation beam when the radiation beam exits the contaminant traps, the illumination system being provided with a first set of reflective elements and a second set of reflective elements, each reflective element of the first set being arranged to reflect a part of the radiation beam downstream the contaminant traps onto a reflective element of the second set, each reflective element of the second set being arranged to reflect the radiation beam in a further optical path towards the patterning device, each reflective element having a predetermined position and shape so that in use the predetermined non-uniformity in the radiation beam is reduced.

11. A lithographic apparatus according to claim 1, wherein each of the platelets is hinged at a hinge-axis, each hinge-axis being oriented such that a virtual line coinciding with the hinge-axis extends through the light emitting point when the corresponding platelet is in a straight plane.

12. A lithographic apparatus according to claim 11, wherein each of the platelets comprises a slot, each slot being oriented such that a virtual line coinciding with a longitudinal direction of the slot extends through the light emitting point when the corresponding platelet is in a straight plane.

13. A device manufactured by a lithographic apparatus according to claim 1.

14. A contaminant trapping system for use in an illumination system of a lithographic apparatus, the trapping system comprising a contaminant trap having a central zone and a peripheral zone, the trap comprising a plurality of platelets, each of the platelets extending from the central zone substantially outwards through the peripheral zone, wherein each of the platelets has a normal with a component directed towards the central zone, the plurality of platelets being oriented such that all virtual planes which coincide with the plurality of platelets meet outside the trap at a predetermined point that is intended to correspond with a light emitting point of the lithographic apparatus.

15. A contaminant trapping system according to claim 14, wherein the central zone comprises a rotation axis around which the plurality of platelets can rotate, the rotation axis coinciding with a virtual line that extends substantially through the predetermined point.

16. A contaminant trapping system according to claim 15, wherein the contaminant trap is provided with a driving mechanism for rotating the trap.

17. A contaminant trapping system according to claim 16, wherein the driving mechanism is situated outside the central zone.

18. A contaminant trapping system according to claim 14, wherein the system comprises a plurality of contaminant traps.

19. A contaminant trapping system according to claim 14, wherein the plurality of platelets have a rotational symmetry with respect to the central zone.

20. A contaminant trapping system according to claim 14, wherein the trapping system comprises a first contaminant trap having platelets and a second contaminant trap having platelets, the contaminant traps being aligned so that in use, some light emitted from the predetermined point can propagate through the contaminant traps, wherein the first contaminant trap can rotate relative to the second contaminant trap around a virtual line that substantially extends through the predetermined point.

21. A contaminant trapping system according to claim 20, wherein the platelets of one of the first and the second contaminant traps differ in number and/or angular distribution from the number and/or angular distribution of the platelets of the other of the first and the second contaminant trap, such that at any rotational position, one or more of the platelets of one of the first and the second contaminant traps is blocking radiation that has passed through the other of the first and the second contaminant traps.

22. A contaminant trapping system according to claim 21, wherein the contaminant trapping system is arranged such that in use a substantially predetermined non-uniformity is present in the radiation beam when the beam exits the contaminant traps.

23. A contaminant trapping system according to claim 14, wherein each of the platelets is hinged at a hinge-axis, each hinge-axis being oriented such that a virtual line coinciding with the hinge-axis extends through the predetermined point when the corresponding platelet is in a straight plane.

24. A contaminant trapping system according to claim 23, wherein the each of platelets comprises a slot, the slot being oriented such that a virtual line coinciding with a longitudinal direction of the slot extends through the light emitting point when the corresponding platelet is in a straight plane.

25. A device manufacturing method comprising:
conditioning a radiation beam substantially from a light emitting point using an illumination system; and
trapping contaminant particles in the illumination system using a trapping system comprising a contaminant trap having a central zone and a peripheral zone, the trap comprising a plurality of platelets, each of the platelets extending from the central zone substantially outwards through the peripheral zone, wherein each of the platelets has a normal with a component directed towards the central zone, the plurality of platelets being oriented such that all planes which coincide with the plurality of platelets meet outside the trap substantially at a predetermined point that substantially coincides with a light emitting point of the illumination system.

26. A device manufacturing method according to claim 25, further comprising rotating the plurality of platelets around a rotation axis which coincides with a virtual line that extends substantially through the light emitting point.

27. A device manufacturing method according to claim 26, wherein the trapping system comprises a first contaminant trap having platelets and a second contaminant trap having platelets, the first and the second contaminant traps being aligned so that some light emitted from the light emitting point can propagate through the first and the second contaminant traps, wherein the method further comprises rotating the first contaminant trap relative to the second contaminant trap around a virtual line that substantially extends through the light emitting point.

28. A device manufacturing method according to claim 27, wherein the method further comprises reducing a non-uniformity in the radiation beam that exits the first and the second contaminant traps.

29. A device manufacturing method according to claim 28, wherein the method further comprises:
providing a predetermined non-uniformity in the radiation beam as it exits the first and the second contaminant traps;
reflecting the radiation beam downstream of the first and the second contaminant traps onto a first set of reflective elements; and
reflecting the radiation beam downstream of the first set of reflective elements onto a second set of reflecting elements, each of the reflective elements having a predetermined size and/or shape so that the predetermined non-uniformity is reduced.

30. A device manufactured according to claim 25.

31. A method for improving trapping of contaminants in an illumination system of a lithographic apparatus, the method comprising trapping contaminants with a trapping system, the system comprising a contaminant trap having a central zone and a peripheral zone, the trap comprising a plurality of platelets, each of the plurality of platelets extending from the central zone substantially outwards through the peripheral zone, wherein each of the platelets has a normal with a component directed towards the central zone, the plurality of platelets being oriented such that all planes which coincide with the plurality of platelets meet outside the trap substantially at a predetermined point that coincides with a light emitting point of the illumination system.

32. A method according to claim 31, wherein the method further comprises rotating the plurality of platelets around a rotation axis which coincides with a virtual line that extends substantially through the light emitting point of the illumination system.

33. A method according to claim 32, wherein the trapping system comprises a first contaminant trap having a plurality of platelets and a second contaminant trap having a plurality of platelets, the first and the second contaminant traps being aligned so that some light emitted from the light emitting point can propagate through the first and the second contaminant traps, wherein the method further comprises rotating the first contaminant trap relative to the second contaminant trap around a virtual line that substantially extends through the light emitting point.

34. A method according to claim 33, wherein the method further comprises reducing a non-uniformity in the radiation beam that exits the first and the second contaminant traps.

35. A method according to claim 34, wherein the method further comprises:
providing a predetermined non-uniformity in the radiation beam as it exits the first and the second contaminant traps;
reflecting the radiation beam downstream of the first and the second contaminant traps onto a first set of reflective elements; and
reflecting the radiation beam downstream of the first set of reflective elements onto a second set of reflecting elements, each of the reflective elements having a predetermined size and/or shape so that the predetermined non-uniformity is reduced.

36. A lithographic apparatus comprising:
an illumination system configured to condition a radiation beam substantially from a light emitting point, wherein the illumination system comprises a contaminant trapping system, the trapping system comprising a first contaminant trap having a plurality of platelets and a second contaminant trap having a plurality of platelets, the first and the second contaminant traps being aligned so that some light emitted from the light emitting point can propagate through the first and the second contaminant traps, wherein the first contaminant trap can rotate relative to the second contaminant trap around a virtual line that substantially extends through the light emitting point, wherein the platelets of one of the first and the second contaminant traps differ in number and/or angular distribution from the number and/or angular distribution of the platelets of the other of the first and the second contaminant traps such that at any rotational position, one of the platelets of the one contaminant trap is blocking radiation that has passed through the other contaminant trap.

37. A lithographic apparatus according to claim 36, wherein the first and/or the second contaminant trap has a central zone and a peripheral zone and the platelets thereof extend substantially outwards through the peripheral zone, wherein one of said platelets thereof has a normal with a component directed towards the central zone.

38. A lithographic apparatus according to claim 36, wherein each of the platelets of the first and/or the second contaminant trap is hinged at a hinge-axis, each hinge-axis being oriented such that a virtual line coinciding with the hinge-axis extends through the light emitting point when the corresponding platelet is in a straight plane.

39. A lithographic apparatus according to claim 38, wherein said each of the platelets comprises a slot, the slot being oriented such that a virtual line coinciding with a longitudinal direction of the slot extends through the light emitting point when the corresponding platelet is in a straight plane.

40. A lithographic apparatus according to claim 36, wherein the lithographic apparatus further comprises a patterning device which is capable of imparting the radiation beam with a pattern in its cross-section to form a patterned radiation beam, the illumination system being arranged to reduce a non-uniformity in the radiation beam upstream of the patterning device.

41. A lithographic apparatus according to claim 40, wherein the first and the second contaminant traps are arranged such that in use, a substantially predetermined non-uniformity is present in the radiation beam when the radiation beam exits the first and the second contaminant traps, the illumination system being provided with a first set of reflective elements and second set of reflective elements, each reflective element of the first set being arranged to reflect a part of the radiation beam downstream the first and the second contaminant traps onto a reflective element of the second set, each reflective element of the second set being arranged to reflect the radiation beam in a further optical path towards the patterning device, each reflective element having a predetermined position and shape so that in use the predetermined non-uniformity in the radiation beam is reduced.

42. A device manufactured by a lithographic apparatus according to claim 36.

43. A contaminant trapping system for use in an illumination system of a lithographic apparatus, wherein the trapping system comprises a first contaminant trap having a plurality of platelets and a second contaminant trap having a plurality of platelets, the first and the second contaminant traps being aligned so that in use some light emitted from a predetermined point situated outside the first and the second contaminant traps can propagate through the first and the second contaminant traps, wherein the first contaminant trap can rotate relative to the second contaminant trap around a virtual line that substantially extends through the predetermined point, wherein the platelets of one of the first and the second contaminant traps differ in number and/or angular distribution from the number and/or angular distribution of the platelets of the other of the first and the second contaminant traps.

44. A trapping system according to claim 43, wherein the first and/or the second contaminant trap has a central zone and a peripheral zone, the platelets of said contaminant trap having the central zone and the peripheral zone extending substantially outwards through the peripheral zone, wherein one of said platelets of said contaminant trap having the central zone and the peripheral zone has a normal with a component directed towards the central zone.

45. A trapping system according to claim 43, wherein each of the platelets of the first and/or the second contaminant trap is hinged at a hinge-axis, each hinge-axis being oriented such that a virtual line coinciding with the hinge-axis extends through the light emitting point when the corresponding platelet is in a straight plane.

46. A trapping system according to claim 45, wherein said each of the platelets comprises a slot, the slot being oriented such that a virtual line coinciding with a longitudinal direction of the slot extends through the light emitting point when the corresponding platelet is in a straight plane.

47. A trapping system according to claim 43, wherein the contaminant trapping system is arranged such that in use a substantially predetermined non-uniformity is present in the radiation beam when the beam exits the first and the second contaminant traps.

48. A lithographic apparatus comprising:
an illumination system configured to condition a radiation beam substantially from a light emitting point, wherein the illumination system comprises a contaminant trapping system, the trapping system comprising a first contaminant trap having platelets and a second contaminant trap having platelets, the first and the second contaminant traps being aligned so that light emitted from the light emitting point can propagate through the first and the second contaminant traps, wherein the first contaminant trap can rotate relative to the second contaminant trap around a virtual line that substantially extends through the light emitting point; and
a patterning device which is capable of imparting the radiation beam with a pattern in its cross-section to form a patterned radiation beam,
the illumination system further being arranged to reduce a non-uniformity in the radiation beam upstream of the patterning device.

49. A lithographic apparatus according to claim 48, wherein the first and the second contaminant traps are arranged such that in use a substantially predetermined non-uniformity is present in the radiation beam when the radiation beam exits the first and the second contaminant traps, the illumination system being provided with a first set of reflective elements and a second set of reflective elements, each reflective element of the first set being arranged to reflect a part of the radiation beam downstream the first and the second contaminant traps onto a reflective element of the second set, each reflective element of the second set being arranged to reflect the radiation beam in a further optical path towards the patterning device, each reflective element having a predetermined position and shape so that in use the predetermined non-uniformity in the radiation beam is reduced.

50. A lithographic apparatus according to claim 48, wherein the platelets of one of the first and the second contaminant traps differ in number and/or angular distribution from the other of the first and the second contaminant traps.

51. A lithographic apparatus according to claim 48, wherein the first and/or the second contaminant trap has a central zone and a peripheral zone, the platelets of said first and/or second contaminant trap having the central zone and the peripheral zone extending substantially outwards through the peripheral zone, wherein each of the platelets of said first and/or second contaminant trap having the central zone and the peripheral zone has a normal with a component directed towards the central zone.

52. A lithographic apparatus according to claim 48, wherein each of the platelets of the first and/or the second contaminant traps is hinged at a hinge-axis, each hinge-axis being oriented such that a virtual line coinciding with the hinge-axis extends through the light emitting point when the corresponding platelet is in a straight plane.

53. A lithographic apparatus according to claim 52, wherein said each of the platelets comprises a slot, the slot being oriented such that a virtual line coinciding with a longitudinal direction of the slot extends through the light emitting point when the corresponding platelet is in a straight plane.

54. A device manufactured by a lithographic apparatus according to claim 48.

55. A contaminant trapping system for use in an illumination system of a lithographic apparatus, wherein the trapping system comprises a first contaminant trap having platelets and a second contaminant trap having platelets, the first and the second contaminant traps being aligned so that in use some light emitted from a predetermined point situated outside the first and the second contaminant traps can propagate through the first and the second contaminant traps, wherein the first contaminant trap can rotate relative to the second contaminant trap around a virtual line that substantially extends through the predetermined point, wherein the contaminant trapping system is arranged such that is use a substantially predetermined non-uniformity is present in the radiation beam when the beam exits the first and the second contaminant traps.

56. A contaminant trapping system according to claim 55, wherein the first and the second contaminant traps are arranged such that in use a substantially predetermined non-uniformity is present in the radiation beam when the radiation beam exits the first and the second contaminant traps, the illumination system being provided with a first set of reflective elements and a second set of reflective elements, each reflective element of the first set being arranged to reflect a part of the radiation beam downstream the first and the second contaminant traps onto a reflective element of the second set, each reflective element of the second set being arranged to reflect the radiation beam in a further optical path towards the patterning device, each reflective element having a predetermined position and shape so that in use the predetermined non-uniformity in the radiation beam is reduced.

57. A contaminant trapping system according to claim 55, wherein the platelets of one of the first and the second contaminant traps differ in number and/or angular distribution from the number and/or angular distribution of the platelets of the other of the first and the second contaminant traps.

58. A contaminant trapping system according to claim 55, wherein the first and/or the second contaminant trap has a central zone and a peripheral zone, the platelets of said first and/or second contaminant trap having the central zone and the peripheral zone extending substantially outwards through the peripheral zone, wherein each of the platelets of said first and/or second contaminant trap having the central zone and the peripheral zone has a normal with a component directed towards the central zone.

59. A trapping system according to claim 55, wherein each of the platelets of the first and/or the second contaminant trap is hinged at a hinge-axis, each hinge-axis being oriented such that a virtual line coinciding with the hinge-axis extends through the light emitting point when the corresponding platelet is in a straight plane.

60. A trapping system according to claim 59, wherein said each of the platelets comprises a slot, the slot being oriented such that a virtual line coinciding with a longitudinal direction of the slot extends through the light emitting point when the corresponding platelet is in a straight plane.

61. A device manufacturing method comprising
conditioning a radiation beam substantially from a light emitting point using an illumination system;
trapping contaminant particles in the illumination system using a trapping system comprising a first contaminant trap having platelets and a second contaminant trap having platelets, the first and the second contaminant traps being aligned so that some light emitted from the light emitting point can propagate through the first and the second contaminant traps; rotating the first contaminant trap relative to the second contaminant trap around a virtual line that substantially extends through the light emitting point; and reducing a non-uniformity in the radiation beam the exits the first and the second contaminant traps.

62. A device manufacturing method according to claim 61, wherein the method further comprises:

providing a predetermined non-uniformity in the radiation beam as it exits the first and the second contaminant traps;

reflecting the radiation beam downstream of the first and the second contaminant traps onto a first set of reflective elements; and reflecting the radiation beam downstream of the first set of reflective elements onto a second set of reflecting elements, each of the reflective elements having a predetermined size and/or shape so that the predetermined non-uniformity is reduced.

63. A device manufactured according to claim 61.

64. A lithographic apparatus comprising:

an illumination system configured to condition a radiation beam substantially from a light emitting point, wherein the illumination system comprises a contaminant trapping system, the trapping system comprising a contaminant trap having a central zone and a peripheral zone, the trap comprising a plurality of platelets extending substantially outwards through the peripheral zone, wherein each of the platelets is hinged at a hinge-axis, wherein each hinge-axis is oriented such that a virtual line coinciding with the hinge-axis extends through the light emitting point when the corresponding platelet is in a straight plane.

65. A lithographic apparatus according to claim 64, wherein each of the platelets comprises a slot, the slot being oriented such that a virtual line coinciding with a longitudinal direction of the slot extends through the light emitting point when the corresponding platelet is in a straight plane.

66. A lithographic apparatus according to claim 64, wherein each of the platelets coincides with a virtual plane that extends through the light emitting point.

67. A lithographic apparatus according to claim 66, wherein each of the platelets has a normal with a component directed towards the central zone.

68. A lithographic apparatus according to claim 64, wherein the central zone comprises a rotation axis around which the plurality of platelets can rotate, the rotation axis coinciding with a virtual line that extends substantially through the light emitting point.

69. A lithographic apparatus according to claim 64, wherein the trapping system comprises a plurality of contaminant traps.

70. A lithographic apparatus according to claim 64, wherein the plurality of platelets have a rotational symmetry with respect to the central zone.

71. A lithographic apparatus according to claim 64, wherein the contaminant trap is provided with a driving mechanism for rotating the trap.

72. A lithographic apparatus according to claim 71, wherein the driving mechanism is situated outside the central zone.

73. A lithographic apparatus according to claim 64, wherein the trapping system comprises a first contaminant trap having platelets and a second contaminant trap having platelets, the first and the second contaminant traps being aligned so that some light emitted from the light emitting point can propagate through the first and the second contaminant traps, wherein the first contaminant trap can rotate relative to the second contaminant trap around a virtual line that substantially extends through the light emitting point.

74. A lithographic apparatus according to claim 73, wherein the platelets of the first or the second contaminant trap differ in number and/or angular distribution from the number and/or angular distribution of the platelets of the other of the first and the second contaminant trap, such that one or more of the platelets of one of the first and the second contaminant traps is at any rotational position blocking radiation that has passed through the other of the first and the second contaminant traps.

75. A lithographic apparatus according to claim 73, wherein the lithographic apparatus further comprises a patterning device which is capable of imparting the radiation beam with a pattern in its cross-section to form a patterned radiation beam, the illumination system further being arranged to reduce a non-uniformity in the radiation beam upstream of the patterning device.

76. A lithographic apparatus according to claim 75, wherein the first and the second contaminant traps are arranged such that in use a substantially predetermined non-uniformity is present in the radiation beam when the radiation beam exits the first and the second contaminant traps, the illumination system being provided with a first set of reflective elements and a second set of reflective elements, each reflective element of the first set being arranged to reflect a part of the radiation beam downstream the first and the second contaminant traps onto a reflective element of the second set, each reflective element of the second set being arranged to reflect the radiation beam in a further optical path towards the patterning device, each reflective element having a predetermined position and shape so that is use the predetermined non-uniformity in the radiation beam is reduced.

77. A device manufactured by a lithographic apparatus according to claim 64.

78. A contaminant trapping system for use in an illumination system of a lithographic apparatus, the trapping system comprising a contaminant trap having a central zone and a peripheral zone, the trap comprising a plurality of platelets extending substantially outwards through the peripheral zone, wherein each of the plurality of platelets is hinged at a hinge-axis, wherein each hinge-axis is oriented such that a virtual line coinciding with the hinge-axis extends through a predetermined point when the corresponding platelet is in a straight plane, the predetermined point being intended to correspond with a light emitting point of the lithographic apparatus.

79. A contaminant trapping system according to claim 78, wherein each of the plurality of platelets comprises a slot, the slot being oriented such that a virtual line coinciding with a longitudinal direction of the slot extends through the predetermined point when the corresponding platelet is in a straight plane.

80. A contaminant trapping system according to claim 79, wherein the central zone comprises a rotation axis around which the plurality of platelets can rotate, the rotation axis coinciding with a virtual line that extends substantially through the predetermined point.

81. A contaminant trapping system according to claim 80, wherein the contaminant trap is provided with a driving mechanism for rotating the trap.

82. A contaminant trapping system according to claim 81, wherein the driving mechanism is situated outside the central zone.

83. A contaminant trapping system according to claim 78, wherein the system comprises a plurality of contaminant traps.

84. A contaminant trapping system according to claim 78, wherein the plurality of platelets have a rotational symmetry with respect to the central zone.

85. A contaminant trapping system according to claim 78, wherein each of the plurality of platelets coincides with a virtual plane that substantially extends through the predetermined point.

86. A contaminant trapping system according to claim 85, wherein each of the plurality of platelets has a normal with a component directed towards the central zone.

87. A contaminant trapping system according to claim 78, wherein the trapping system comprises a first contaminant trap having platelets and a second contaminant trap having platelets, the first and the second contaminant traps being aligned so that in use, some light emitted from the predetermined point can propagate through the first and the second contaminant traps, wherein the first contaminant trap can rotate relative to the second contaminant trap around a virtual line that substantially extends through the predetermined point.

88. A contaminant trapping system according to claim 87, wherein the platelets of the first or the second contaminant trap differ in number and/or angular distribution from the number and/or angular distribution of the platelets of the other of the first and the second contaminant trap, such that one of the platelets of one of the first and the second contaminant traps is at any rotational position blocking radiation that has passed through the other of the first and the second contaminant traps.

89. A contaminant trapping system according to claim 87, wherein the contaminant trapping system is arranged such that in use, a substantially predetermined non-uniformity is present in the radiation beam when the beam exits the first and the second contaminant traps.

* * * * *